United States Patent [19]

Mart et al.

[11] Patent Number: 5,440,519
[45] Date of Patent: Aug. 8, 1995

[54] SWITCHED MEMORY EXPANSION BUFFER

[75] Inventors: Chase S. Mart, Meridian; Kenneth J. Kledzik, Boise, both of Id.

[73] Assignee: Micron Semiconductor, Inc., Boise, Id.

[21] Appl. No.: 189,813

[22] Filed: Feb. 1, 1994

[51] Int. Cl.[6] ............................................. G11C 5/14
[52] U.S. Cl. ................................. 365/226; 365/52; 365/189.09; 365/230.03
[58] Field of Search .................. 365/226, 227, 184.07, 365/52, 230.03

[56] References Cited

U.S. PATENT DOCUMENTS

| | | | |
|---|---|---|---|
| 4,137,565 | 1/1979 | Mager et al. | 364/200 |
| 4,683,382 | 7/1987 | Sakurai et al. | 365/227 |
| 4,780,854 | 10/1988 | Watanabe et al. | 365/226 |
| 4,802,027 | 1/1989 | Talmadge et al. | 360/60 |
| 4,845,419 | 7/1989 | Hacker | 320/39 |
| 4,862,413 | 8/1989 | Hashimoto et al. | 363/189.09 |
| 4,977,537 | 12/1990 | Dias et al. | 364/900 |
| 5,046,052 | 9/1991 | Miyaji et al. | 365/227 |
| 5,124,631 | 6/1992 | Terashima | 365/189.09 |
| 5,153,452 | 10/1992 | Iwamura et al. | 365/226 |
| 5,153,710 | 10/1992 | McCain | 365/228 |
| 5,272,664 | 12/1993 | Alexander et al. | 365/52 |
| 5,305,270 | 4/1994 | Kim | 365/189.09 |
| 5,309,399 | 5/1994 | Murotani | 365/189.09 |
| 5,321,653 | 6/1994 | Suh et al. | 365/226 |

OTHER PUBLICATIONS

"Fixed 5V 800mA Low Dropout Positive Regulator", By Burr–Brown, Reg1117-5, pp. 1–7.
"Low–Voltage (3V) DRAM Design Issues", By Micron Semiconductor, Inc., TN-04-14, pp. 6-19-6-20.

*Primary Examiner*—Joseph A. Popek
*Assistant Examiner*—Tan Nguyen
*Attorney, Agent, or Firm*—Arnold, White & Durkee

[57] ABSTRACT

A module such as a SIMM or other type of memory module is provided with supply power at a higher potential than the operating potential of semiconductor memory devices on the module. A voltage regulator circuit on the module reduces the potential supplied to the memory devices and provides the power to the memory devices at regulated potential than would be achieved by providing the supply power at the desired potential in the first place. Advantages include reduction in error rate, even when semiconductor components are used which are unusually susceptible to variations in supply potential.

22 Claims, 2 Drawing Sheets

SWITCHED MEMORY EXPANSION BUFFER

FIELD OF THE INVENTION

This invention relates to voltage regulator circuits in circuit modules. The invention is useful in array modules, in which signals are received by a major component, such as a printed circuit board, and the signals are transferred to subcomponents in essentially the same form. The invention is particularly useful when used with computer memory arrays.

This invention further relates to arrays of semiconductor circuit devices, in which a plurality of integrated circuit chips are mounted to a printed circuit board or the like for connection to a main circuit board (mother board), and to power supply regulation of SIMM (single in line memory module) arrays, and similar arrays.

BACKGROUND OF THE INVENTION

IC chips come in a variety of forms such as dynamic random access memory (DRAM) chips, static random access memory (SRAM) chips, read only memory (ROM) chips, gate arrays, and so forth. The chips are interconnected in myriad combinations on printed circuit boards by a number of techniques, such as socketing and soldering. Interconnections among chips arrayed on printed circuit boards are typically made by conductive traces formed by photolithography and etching processes. Semiconductor circuit devices, including DRAMs, SRAMs and gate arrays are essentially switching devices.

One circuit-board-mounted semiconductor chip array that is of particular interest is the SIMM (single in line memory module). SIMM boards are typically constructed with such capacitors, which are usually located beneath or adjacent memory array circuit chips on the SIMM. Single in line packages (SIPs) are similar in design to SIMMs, except that instead of having a card edge-type connector, SIMMs have pins which are either socketably or solderably mounted on a bus. SIMMs are described in U.S. Pat. No. 4,727,513, to Clayton and assigned to Wang Labs, and in Micron Semiconductor's DRAM Data Book for 1993.

SIMM (single in line memory module) boards are circuit arrays which consist of byte multiples of memory chips arranged on a printed circuit board or comparable mounting arrangement. The SIMM board is connected to a circuit control board by an edge connector.

The SIMM is a highly space-efficient memory board having no on board address circuitry and which is designed to plug directly into the address, data and power-supply busses of a computer so that the randomly-addressable memory cells of the SIMM can be addressed directly by the computer's CPU rather than by a bank-switching technique commonly used in larger memory expansion boards. Memory cells on the SIMM are perceived by the computer's CPU as being no different than memory cells found on the computer's mother board. Since SIMMs are typically populated with byte multiples of DRAMs, for any eight bit byte or sixteen bit byte or word of information stored within a SIMM, each of the component bits will be found on a separate chip and will be individually addressable by column and row. One edge of a SIMM module is a card-edge connector, which plugs into a socket on the computer, is directly connected to the computer busses required for powering and addressing the memory on the SIMM.

SIMMs and related modules are constructed with JEDEC standardized terminal configurations, examples being JEDEC 72 pin configuration and JEDEC 30 pin configuration. At present, the 72 pin configuration has several "no connect" terminals. If a computer motherboard provides potential at one of the "no connect" terminals, a conventional module will not be affected.

For purposes of this disclosure, the reference to a "standard compatible module" means a module that is intended to be plug fit into a type of computer or other circuit board and which is in a format that is industry generic. Standard compatible modules are able to be installed onto the computer or other circuit board and meet expectations as to pin locations of power supply and other signal lines. Modules which meet JEDEC standard configurations would be standard compatible modules. At the time of the filing of this disclosure, there is not believed to be an industry standard for SIMM modules that accept nonstandard power supply potentials.

The control board may be any of a number of circuits which address memory arrays. Examples include computer mother boards, daughter boards which plug into a mother board, wherein the daughter board functions as a mother board for the SIMM module, peripheral devices with a capability of using add-on memory, and special purpose equipment which uses memory. It is also possible to use small modules of arrays of similar circuit for purposes other than memory applications.

A computer's power supply circuit must accommodate the demands and fluctuations of most or all internal devices in the computer, including the CPU and related circuitry, memory devices, and storage devices. In addition, the availability of corresponding "clean" power from line current is limited. The ability to accommodate tight tolerances of potentials for a portion of the computer may add undue complexity to the entire power supply circuit. When multiple circuits are connected to a single power supply, it is likely that the current draw of the multiple circuits will cause fluctuations in the power supply circuit. Therefore, it is advantageous to have a circuit for limiting variations in potential located on individual units, such as SIMM boards.

DRAM semiconductor memory parts are typically rated at a power supply potential $V_{cc}$ of 5.0 volts ±10%. Some manufactured parts are less than fully reliable when $V_{cc}$ varies by 10%, and so are rated at ±5%, or are otherwise subject to reduced tolerance to variations in potential.

A popular voltage regulator circuit is a three-pin device that can achieve a regulation of potential to a tolerance of approximately ±1%. This circuit generates a potential drop from its input to its output, so that the input power supply requirement for the voltage regulator circuit is that the power supply potential be approximately 1 volt higher than its output. This means that the use of such a voltage regulator circuit would reduce potential at its output to unacceptably low levels, or that potential at the supply be unacceptably high for operation without the voltage regulator circuit.

In the use of boards designed to function at reduced potentials, such as a daughter board having 3.5 volt devices that and connected to a 5 volt mother board, it is advantageous if reduced power boards have a circuit that allows the reduced power board to adapt to use with the higher voltage board.

It would likewise be desirable to provide modules with a power supply at a high potential and permit a voltage regulator circuit on the module to reduce the potential on the module to a desired level. This would provide a stable power output. It would be further desirable that a motherboard also be able to operate with modules that do not have the voltage regulator circuit.

SUMMARY OF THE INVENTION

In accordance with the present invention, a voltage regulator provides current for a circuit module having an array of similar semiconductor circuit devices, such as a SIMM (single in line memory module) array of semiconductor circuit devices. The semiconductor circuit devices in the array are designed to accept a range of potentials that, and the potentials provided by the voltage regulator are within that range. The voltage regulator circuit receives current at elevated supply potentials and provides an output at a controlled potential to the array. This provides clean power to the memory module and permits the establishment of internal tolerances for variation in potential which are more restrictive than that afforded by an external power supply.

The elevated supply potentials are provided at a "no connect" terminal on the module, and a terminal for power supply at the operating potential is not connected on the module. The use of the "no connect" terminal permits a motherboard to accept modules that do not have the voltage regulator and require the power supply at the operating potential.

In a preferred embodiments, the module accepts an elevated potential of between 6 and 18 volts, and the component parts are operated at 3.3 or 5.0 volts.

DETAILED DESCRIPTION OF THE PREFERRED EMBODIMENTS

Figure 1:
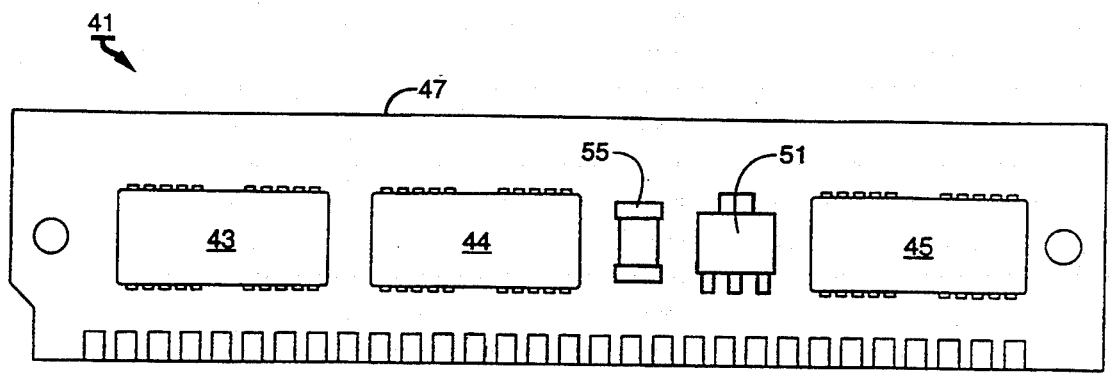
FIG. 1 shows in plan view, a single in-line memory module (SIMM), in which a voltage regulator circuit provides "clean" power.
Figure 3A:
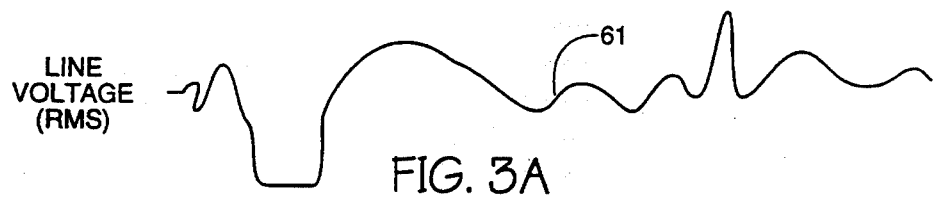
FIGS. 3A-3D show theoretical fluctuations in potential of power supply current, 5 volt power supply, 12 volt power supply, and the regulated 5 volt output of the voltage regulator.
Figure 3B:
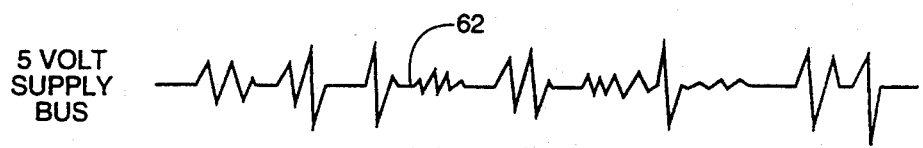
Figure 3C:
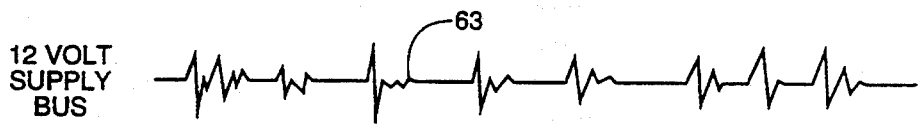
Figure 3D:

FIG. 1 shows a SIMM (single in-line memory module) 41 constructed in accordance with the present invention. The particular module 41 shown in FIG. 1 is a 30 pin SIMM. Pin 24, is a "no connect" pin in 30 pin "by 9" modules of 4 megabytes or less. On the module shown in FIG. 1, pin 24 is supplied with a 12 volt power supply in order for the module 41 to function.

The module 41 has a plurality of semiconductor DRAM memory chips 43-45 which are mounted to a printed circuit board 47, along with decoupling capacitors (not shown) for each of the memory chops 43-45. The memory chips 43-45 require a power supply, such as, in this embodiment, 5 volts. This power, referred to as $V_{cc}$, is normally supplied at pins 1 and 30, with ground at pins 9 and 22. When installed onto a motherboard (not shown), this power is present at pins 1 and 30 because it is desirable that the motherboard accept conventional SIMMs which require $V_{cc}$ connections.

Figure 2:
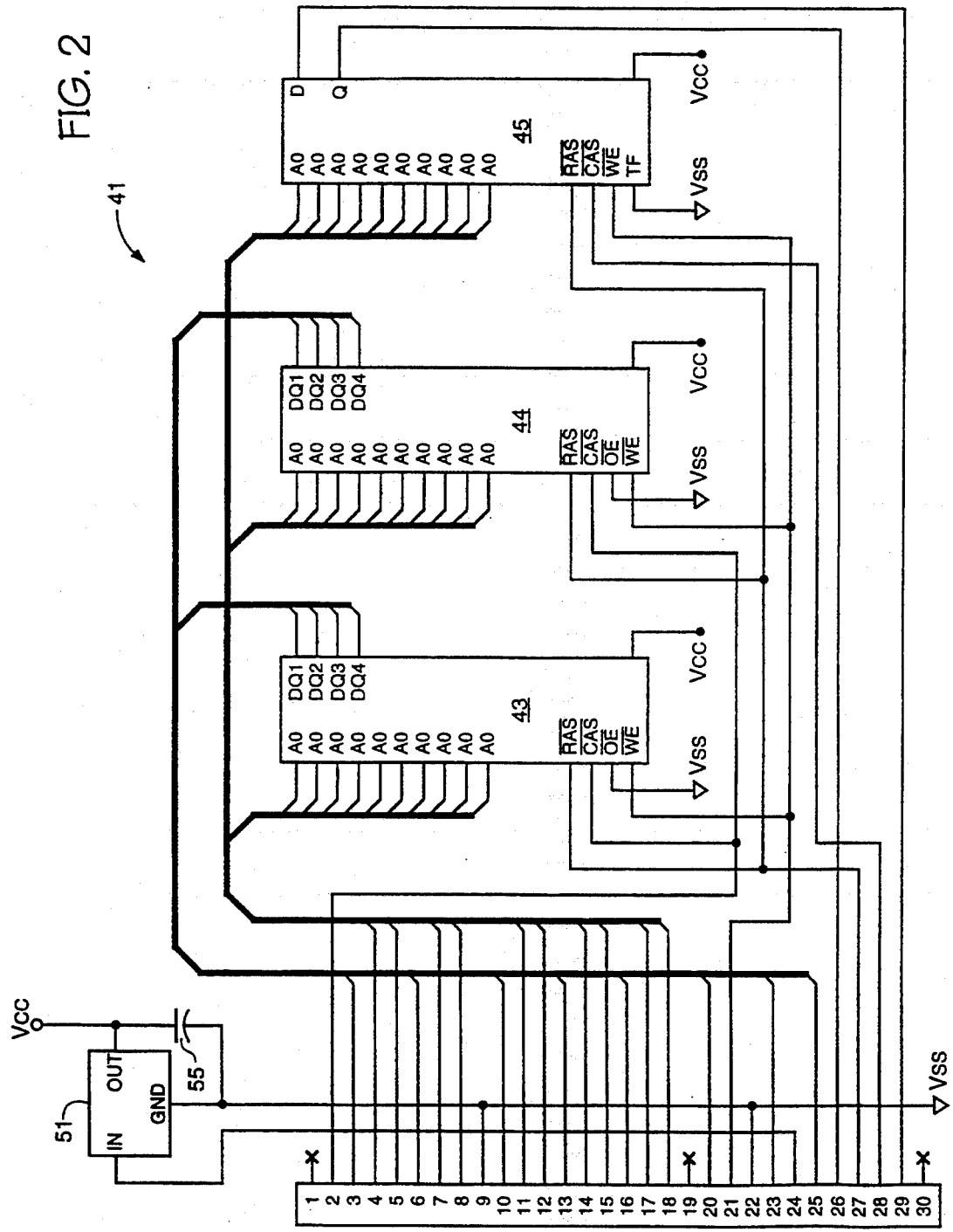
FIG. 2 shows a simplified schematic diagram of the module of FIG. 1.

In the inventive module 41, a voltage regulator chip 51 is used to provide a regulated power supply $V_{CC\ REG}$ to the DRAM memory chips 43-45. Pins 1 and 30, which are supplied with $V_{cc}$ from the motherboard, are not connected to further circuitry on the module 41. Pins 9 and 22 are at ground potential ($V_{ss}$) and are connected to both the voltage regulator 51 and to the appropriate connections on the DRAM memory chips 43-45. The connections of the voltage regulator 51 to the memory chips 43-45 is shown in FIG. 2.

The voltage regulator 51 requires an elevated potential power supply in order to provide an output potential at $V_{cc}$ (or $V_{CC\ REG}$). That is because of a potential drop which occurs as current is passed through a circuit device such as the voltage regulator 51. The voltage regulator 51 has a recommended supply potential is between 6.5 and 15 volts (for the Burr Brown device). Its dropout potential ranges up to 1.2 volts. Therefore, the voltage regulator 51 requires a power supply potential of between 6 volts and 15 volts in order to provide its 5 volt output. It is likely that the voltage regulator will accept momentary fluctuations of 18 volts and will accept higher surges without a substantial change in output potential. With conventional computer power supplies, power is available includes power 5 volts and 12 volts, although other potentials may also be available. The 12 volt potential is chosen to power the voltage regulator 51 because it is unlikely that power fluctuations and power draw from the 12 volt supply will result in the potential dropping significantly close to the 6 volts required to operate the voltage regulator 51. In the preferred embodiment, the voltage regulator 51 is a model LT1117CST-5 voltage regulator, manufactured by Linear Technology of Milpitas, Calif., or a REG117-5 voltage regulator, manufactured by Burr Brown of Tuscon, Ariz.

The voltage regulator 51 has three external connections —the 12 volt supply potential, ground, also designated $V_{ss}$, and the 5 volt regulated output, also designated $V_{cc}$. A single ground is used for supply and output of the voltage regulator 51. In the preferred embodiment, an output capacitor 55 is connected across the output of the voltage regulator 51, between $V_{cc}$ and ground. In the preferred embodiment, the output capacitor 55 has a capacitance of 10 $\mu F$, and the decoupling capacitors associated with each DRAM 43-45 each have a capacitance of 1 $\mu F$. The output capacitor 55 is required to stabilize the output of the voltage regulator 51. The use of capacitive decoupling of IC chips on memory modules is described in U.S. Pat. No. 4,879,631, to Johnson and Nevill, for Short-Resistant Decoupling Capacitor System for Semiconductor Circuits.

Since pin 24 is a "no connect" pin on modules of 4 megabytes or less, providing 12 volt on SIMM board sockets at this pin will not affect conventional SIMMs. This is significant, because it is desired that a computer that is modified to accept the inventive module 41 also be able to continue to accept most conventional modules.

FIGS. 3A-D shows the potentials of power supply lines over time for a, 115 volt (nominal) line current (root mean square value) 61, nominal 5 volt power bus 62, a nominal 12 volt power bus 63 and the output potential of the voltage regulator 64. These are projected values, based on empirical experience, rather than the results of actual testing.

As indicated on the graph, the power supply lines, whose potentials are shown at 62 and 63, fluctuate over time. This is partially due to total loads on the power supply, variations in line current, shown at 61, although other causes for the fluctuation exist. The potential of line current 61 typically varies from 110 volts to 130 volts. There is a tendency for this fluctuation in potential to pass through the computer's power supply and to affect the potential 62 conventionally used to power the memory.

It is likely that fluctuations on the 12 volt power supply are as great or greater than fluctuations on the 5 volt power supply. The 12 volt power supply is used for various electromechanical devices, such as disk drives, and therefore is subject to inductance related potential fluctuations. The voltage regulator 51, on the other hand performs in a relatively stable manner at supply potentials generally between 6.2 volts and 18 volts. This results in an output potential, indicated at 64, remaining relatively constant. The minimum supply potential of 6.2 volts is determined by a maximum dropout potential of 1.2 volts at 800 mA.

It is not known whether changes in the 12 volt supply potential 63 substantially affect the output 64 of the voltage regulator 51, although such changes are limited to ±1% for the voltage regulator 51 in the preferred embodiment. It is believed that current draw on the voltage regulator 51 does affect output potential. In any case, this change is insignificant, and so the change in potential 64 is of no consequence.

The semiconductor DRAM memory chips 43-45 are expected to function properly at a wide range of supply potentials $V_{cc}$. In a typical DRAM, such as a MT4C4M4A14 meg×4 DRAM sold by Micron Semiconductor, of Boise, Id., supply potential is rated at between 4.5 and 5.5 volts, with rated high input logic level potential at $V_{cc}+1$. If $V_{cc}$ "bumps" too far up or down, errors occur. This translates to a tolerance for a change in potential of ±10%. The voltage regulator 51 provides an output potential that varies within a limited range, of approximately ±1%.

Quite often, the DRAM memory chips do not pass qualification tests because they are too sensitive to fluctuations in supply potential. If the parts are otherwise functional, the use of the voltage regulator circuit 51 enables their use. Such parts dedicated for use with the voltage regulator circuit 51 are less expensive, and yet are made reliable by guaranteeing that they receive a regulated power supply $V_{CC\,REG}$. In other words, by dedicating the parts for use in applications having limited variation in potential, the parts can pass qualification tests.

The ratio of permissible variation of potential of 10% verses an anticipated range of 1% reduces soft error and reducing need for parity. If parity is eliminated, and the inventive module is used, the overall reliability of the memory is actually enhanced because supplying the memory with "cleaner" power reduces memory error. Since the possibility of "voltage bumping" (variations in potential) is substantially reduced, it is possible to substantially increase reliability of memory, even with memory chips that exhibit a substantially less tolerance for "voltage bumping."

Anticipated variation in potential output of the voltage regulator 51 may be more, as, for example ±2%. It is anticipated that memory chips that have either standard tolerance to "voltage bumping," or less than standard tolerance to "voltage bumping" may be used. Examples of tolerances are ±10%, ±7%, ±5%, ±3%, and ±2%. Therefore, it is possible to use one of the above combinations, provided that the variation in potential output of the voltage regulator 51 is greater than the tolerance to "voltage bumping" of the protected parts. In the preferred embodiment, the variation in potential output of the voltage regulator 51 is 50% greater than the tolerance to "voltage bumping" of the protected parts. It would be advantageous if the variation in potential output of the voltage regulator 51 is 100% or 200% greater than the tolerance to "voltage bumping" of the protected parts.

In addition, soft errors, even in full specification parts, are greatly reduced by providing a "clean" power supply ($V_{CC\,REG}$), and decoupling of main +5 volt power supply. This also eliminates most TTL switching noise, which is in the 5 volt power supply. It is possible that larger surges in potential may occur on the +12 volt line because of switching of inductive devices. Regardless of whether the +12 volt supply power is less noisy, the use of the voltage regulator 51 provides a "clean" output.

The inventive module may also be provided in other configurations. As an example, a 72 pin SIMM is being designed with the inventive voltage regulator configuration. It is anticipated that the invention will also be used without parity, or as a "x 8" module. In such cases, suitable "no connect" pins may be used. Similarly, the inventive module may be provided in other types of modules or boards, including memory cards.

What has been described is a specific embodiment of the invention. It is possible to use the inventive circuit in multiple bank memory systems. It is also possible to include a $V_{CC\,REG}$ output on the module 41, located on one of multiple $V_{cc}$ terminals on the module 41. If the corresponding terminal on a motherboard is disconnected from power supply, then a single regulated module 41 could then provide regulated power ($V_{CC\,REG}$) to other modules. It is possible to use the inventive configuration on other types of modules, such as SRAM modules and modules related to functions other than memory.

While a module with three DRAM ICs is shown in the preferred embodiment, the invention is equally functional with modules having larger numbers of parts. DRAM parts are one of the more likely semiconductor IC parts to be sensitive to changes in potential, but the invention is also useful when used with components other than DRAM memory chips.

The invention is also useful in packaging of bare semiconductor die into a multichip module (MCM), wherein semiconductor parts on the module are provided with current through the voltage regulator 51. It is anticipated that variations can be made on the preferred embodiment and, therefore, the invention should be read as limited only by the claims.

What is claimed is:

1. Array module, for connection to external circuitry, in which a plurality of semiconductor integrated circuit devices are arranged in a manner such that information is obtained by addressing information from a selected number of the integrated circuit devices in the array in a format, characterized by:
   a) a plurality of connection terminals for connection of the module to the external circuitry, in which one of the plurality of connection terminals receives power supply current at an elevated potential, and some of the other connection terminals receive the power supply current at a preferred potential;
   b) a voltage regulator circuit connected to said one connection terminal at an elevated potential, the voltage regulator circuit providing the output to said plurality of integrated circuit devices at the preferred potential, the preferred potential being less than the elevated potential; and
c) the plurality of connection terminals configured to isolate said one connection terminal, at the elevated potential, from external circuitry at the preferred potential.

2. Module as described as in claim 1, further characterized by:
a) at least one of the integrated circuit devices in the array being functional when supplied with a supply power at a rated potential, and having a tolerance to changes in said potential of no more than 5%; and
b) said voltage regulator circuit providing power at a potential approximating said rated potential and at a tolerance of no more than ±2%.

3. Module as described as in claim 1, further characterized by:
the variation in potential output of the voltage regulator at the preferred potential is less than the tolerance to "voltage bumping" of said plurality of integrated circuit devices, thereby reducing the occurrence of soft error over modules which use parity bits but do not use said voltage regulator.

4. Module as described as in claim 1, further characterized by:
the variation in potential output of the voltage regulator at the preferred potential being less than the tolerance to "voltage bumping" of the integrated circuit devices.

5. Module as described as in claim 1, further characterized by:
the variation in potential output of the voltage regulator at the preferred potential being less than the tolerance to "voltage bumping" of the integrated circuit devices by at least 50%.

6. Module as described as in claim 1, further characterized by:
a) the connection terminal for receiving power supply current at an elevated potential being at a location which is normally a "no connect" terminal when a standard compatible module without said voltage regulator circuit is connected to said external circuitry; and
b) the module has connection terminal locations which the standard compatible module would receive the preferred potential from the external circuitry.

7. Semiconductor module having a plurality of semiconductor integrated circuits thereon, for connection to external circuitry, in which a plurality of integrated circuit devices are arranged in a manner such that information is obtained by addressing information from a selected number of the integrated circuit devices in the array in a format, characterized by:
a) a plurality of connection terminals for connection of the module to the external circuitry, in which one of the plurality of connection terminals receives power supply current at an elevated potential, and some of the other connection terminals receive the power supply current at a preferred potential;
b) a voltage regulator circuit connected to said one connection terminal at the elevated potential, the voltage regulator circuit providing an output to said plurality of integrated circuit devices at the preferred potential, the preferred potential being less than the elevated potential; and
c) a connection terminal configuration to isolate said one connection terminal, at the elevated potential, from external circuitry at the preferred potential.

8. Module as described as in claim 7, further characterized by:
said module comprising a substrate onto which said plurality of integrated integrated circuit devices are mounted as bare semiconductor die prior to encapsulation of the parts.

9. Module as described as in claim 7, further characterized by:
a) at least one of the integrated circuit devices in the array being functional when supplied with a supply power at a rated potential, and having a tolerance to changes in said potential of no more than 5%; and
b) said voltage regulator circuit providing power at a potential approximating said rated potential and at a tolerance of no more than ±2%.

10. Module as described as in claim 7, further characterized by:
the variation in potential output of the voltage regulator at the preferred potential is less than the tolerance to "voltage bumping" of said plurality of integrated circuit devices.

11. Module as described as in claim 7, further characterized by:
a) the connection terminal for receiving power supply current at an elevated potential being at a location which is normally a "no connect" terminal when a standard compatible module without said voltage regulator circuit is connected to said external circuitry;
b) the module has connection terminal locations which the standard compatible module would receive the preferred potential from the external circuitry.

12. Memory array module, for connection to external digital switching circuitry, in which a plurality of memory circuit devices are arranged in a manner such that memory information is obtained by addressing bits of information from a selected number of the memory devices in the array in a format, and the format of bits forms a word of memory data such that each word includes bits from each memory device in the selected number of the circuit devices, and wherein the bits are addressed as rows and columns of information in a matrix on each memory device, characterized by:
a) a plurality of connection terminals for connection of the module to the external circuitry, in which one of the plurality of connection terminals receives power supply current at an elevated potential, and some of the connection terminals receive the power supply current at a preferred potential;
b) a voltage regulator circuit connected to said one connection terminal at the elevated potential, the voltage regulator circuit providing an output to said plurality of circuit devices at a preferred potential, the preferred potential being less than the elevated potential; and
c) the plurality of connection terminals configured to isolate said one connection terminal, at the elevated potential, from external circuitry at the preferred potential, so that the module receives its power supply from externally supplied current through the voltage regulator circuit.

13. Module as described as in claim 12, further characterized by:
   a) each memory device having addresses which are arranged in similar matrices of rows and columns on the memory device; and
   b) the addressing of a row of memory devices being accomplished to corresponding rows and columns on each memory device in a row of memory devices in response to address commands.

14. Module as described in claim 13, further characterized by:
   the memory devices being random access memory semiconductor integrated devices, having read and write data bits thereon.

15. Module as described as in claim 12, further characterized by:
   the variation in potential output of the voltage regulator at the preferred potential being less than the tolerance to "voltage bumping" of the integrated circuit devices.

16. Module as described as in claim 12, further characterized by:
   a) the module being provided without a parity bit;
   b) the variation in potential output of the voltage regulator is less than the tolerance to "voltage bumping" of said plurality of the memory devices, thereby reducing the occurrence of soft error over modules which use parity bits but do not use said voltage regulator.

17. Module as described as in claim 12, further characterized by:
   a) at least one of the memory devices being functional when supplied with a supply power at a rated potential, and having a tolerance to changes in said potential of no more than 5%; and
   b) said voltage regulator circuit providing power at a potential approximating said rated potential and at a tolerance of no more than ±2%.

18. Module as described as in claim 12, further characterized by:
   the variation in potential output of the voltage regulator at the preferred potential being less than the tolerance to "voltage bumping" of the integrated circuit devices by at least 50%.

19. Module as described as in claim 12, further characterized by:
   a) the connection terminal for receiving power supply current at an elevated potential being at a location which is normally a "no connect" terminal when a standard compatible module without said voltage regulator circuit is connected to said external circuitry;
   b) the module has connection terminal locations which the standard compatible module would receive the preferred potential from the external circuitry.

20. Semiconductor module having a plurality of semiconductor integrated circuits thereon, for connection to external circuitry, in which a plurality of integrated circuit devices are arranged in a manner such that information is obtained by addressing information from a selected number of the integrated circuit devices in the array in a format, characterized by:
   a) a plurality of connection terminals for connection of the module to the external circuitry, in which one of the plurality of the connection terminals receives power supply current at an elevated potential, and some of the other connection terminals receive the power supply current at a preferred potential;
   b) a voltage regulator circuit connected to said one connection terminal at the elevated potential, the voltage regulator circuit providing an output to said plurality of integrated circuit devices at the preferred potential, the preferred potential being less than the elevated potential; and
   c) a connection configuration to isolate said one connection terminal, at the elevated potential, from external circuitry at the preferred potential, the connection configuration such that the connection terminal for receiving power supply current at the elevated potential being at a location which is normally a "no connect" terminal when a standard compatible module without said voltage regulator circuit is connected to said external circuitry, the module has connection terminal locations which the standard compatible module would receive the preferred potential from the external circuitry.

21. Memory array module, for connection to external digital switching circuitry, in which a plurality of memory circuit devices are arranged in a manner such that memory information is obtained by addressing bits of information from a selected number of the memory devices in the array in a format, and the format of bits forms a word of memory data such that each word includes bits from each memory device in the selected number of the circuit devices, and wherein the bits are addressed as rows and columns of information in a matrix on each memory device, characterized by:
   a) a plurality of connection terminals for connection of the module to the external circuitry, in which one of the connection terminals receives power supply current at an elevated potential, and some of the other connection terminals receive the power supply current at a preferred potential;
   b) a voltage regulator circuit connected to said one connection terminal at the elevated potential, the voltage regulator circuit providing an output to said plurality of circuit devices at the preferred potential, the preferred potential being less than the elevated potential; and
   c) the plurality of connection terminals configured to isolate said one connection terminal, at the elevated potential, from external circuitry at the preferred potential, so that the module receives its power supply from externally supplied current through the voltage regulator circuit, the module being provided without a parity bit, the variation in potential output of the voltage regulator is less than the tolerance to "voltage bumping" of the memory devices, thereby reducing the occurrence of soft error over modules which use parity bits but do not use said voltage regulator.

22. Memory array module, for connection to external digital switching circuitry, in which a plurality of memory circuit devices are arranged in a manner such that memory information is obtained by addressing bits of information from a selected number of the memory devices in the array in a format, and the format of bits forms a word of memory data such that each word includes bits from each memory device in the selected number of the circuit devices, and wherein the bits are addressed as rows and columns of information in a matrix on each memory device, characterized by:
   a) a plurality of connection terminals for connection of the module to the external circuitry, in which one of the connection terminals receives power supply current at an elevated potential, and some of the other connection terminals receive the power supply current at a preferred totential;

b) a voltage regulator circuit connected to said one connection terminal at the elevated potential, the voltage regulator circuit providing an output to said plurality of circuit devices at the preferred potential, the preferred potential being less than the elevated potential; and c) the plurality of connection terminals configured to isolate said one connection terminal, at an elevated potential, from external circuitry at the preferred potential, so that the module receives its power supply from externally supplied current through the voltage regulator circuit, the connection terminals configured such that said one connection terminal receiving power supply current at the elevated potential being at a location which is normally a "no connect" terminal when a standard compatible module without said voltage regulator circuit is connected to said external circuitry, the module has connection terminal locations which the standard compatible module would receive the preferred potential from the external circuitry.

* * * * *